US007700970B2

(12) United States Patent
Saggio et al.

(10) Patent No.: US 7,700,970 B2
(45) Date of Patent: Apr. 20, 2010

(54) INTEGRATED POWER DEVICE HAVING A START-UP STRUCTURE

(75) Inventors: Mario Giuseppe Saggio, Aci Castello (IT); Antonino Longo Minnolo, Messina (IT); Rosalia Germana', Antibes (FR)

(73) Assignees: STMicroelectronics S.r.l., Agrate Brianza (MI) (IT); STMicroelectronics S.A., Montrouge (FR)

( * ) Notice: Subject to any disclaimer, the term of this patent is extended or adjusted under 35 U.S.C. 154(b) by 715 days.

(21) Appl. No.: 11/396,411

(22) Filed: Mar. 31, 2006

(65) Prior Publication Data
US 2006/0245258 A1    Nov. 2, 2006

(30) Foreign Application Priority Data
Apr. 4, 2005   (EP)   .................................. 05425194

(51) Int. Cl.
*H01L 29/00*   (2006.01)
(52) U.S. Cl. .................. 257/110; 257/171; 257/341; 257/401; 257/691; 257/E23.079
(58) Field of Classification Search ................ 257/110, 257/171, 341, 401, 691, E23.079
See application file for complete search history.

(56) References Cited
U.S. PATENT DOCUMENTS

| 6,081,009 | A | * | 6/2000 | Neilson ..................... 257/341 |
| 6,228,719 | B1 |  | 5/2001 | Frisina et al. |
| 6,300,171 | B1 | * | 10/2001 | Frisina ...................... 438/140 |
| 6,404,010 | B2 |  | 6/2002 | Saggio et al. |
| 6,410,958 | B1 | * | 6/2002 | Usui et al. ................... 257/329 |
| 6,498,368 | B2 | * | 12/2002 | Sakamoto et al. ........... 257/341 |
| 6,586,798 | B1 |  | 7/2003 | Frisina |
| 6,611,021 | B1 | * | 8/2003 | Onishi et al. ................ 257/328 |
| 6,614,090 | B2 | * | 9/2003 | Deboy et al. ................ 257/493 |
| 6,621,122 | B2 | * | 9/2003 | Qu ............................. 257/339 |
| 6,673,679 | B1 | * | 1/2004 | Miyasaka et al. ........... 438/268 |
| 6,903,418 | B2 | * | 6/2005 | Iwamoto et al. ............. 257/342 |
| 7,042,046 | B2 | * | 5/2006 | Onishi et al. ................ 257/328 |
| 7,199,006 | B2 | * | 4/2007 | Hshieh ....................... 438/248 |
| 7,211,846 | B2 | * | 5/2007 | Tihanyi ...................... 257/288 |
| 7,253,476 | B2 | * | 8/2007 | Fujihira ...................... 257/341 |
| 7,332,788 | B2 | * | 2/2008 | Ahlers et al. ................ 257/502 |
| 2002/0060340 | A1 |  | 5/2002 | Deboy et al. |
| 2002/0167020 | A1 |  | 11/2002 | Iwamoto et al. |
| 2005/0167742 | A1 | * | 8/2005 | Challa et al. ................ 257/328 |

OTHER PUBLICATIONS

European Search Report from European Application 05425194.7, filed Apr. 4, 2005.
Patent Abstracts of Japan vol. 017, No. 629 (E-1462), Nov. 19, 1993 & JP 05 198816 A (NEC Corp.).

* cited by examiner

Primary Examiner—Eugene Lee
(74) Attorney, Agent, or Firm—Lisa K. Jorgenson; James H. Morris; Wolf, Greenfield & Sacks, P.C.

(57) ABSTRACT

An integrated power device includes a semiconductor body of a first conductivity type comprising a first region accommodating a start-up structure, and a second region accommodating a power structure. The two structures are separated from one another by an edge structure and are arranged in a mirror configuration with respect to a symmetry line of the edge structure. Both the start-up structure and the power structure are obtained using MOSFET devices. Both MOSFET devices are multi-drain MOSFET devices, having mesh regions, source regions and gate regions separated from one another. In addition, both MOSFET devices have drain regions delimited by columns that repeat periodically at a fixed distance. Between the two MOSFET devices there is an electrical insulation of at least 25 V.

20 Claims, 4 Drawing Sheets

INTEGRATED POWER DEVICE HAVING A START-UP STRUCTURE

BACKGROUND OF THE INVENTION

1. Field of the Invention

The present invention relates to an integrated power device having a start-up structure. More specifically the invention relates to the integration of a start-up structure in a power device.

2. Discussion of the Related Art

The invention relates, in particular, but not exclusively, to a multi-drain (MDmesh) MOSFET power device, and the ensuing description is made with reference to this field but only for the purpose of simplifying the explanation.

In the course of the last few years, particular interest has been directed to semiconductor power devices for switched-mode power-supply (SMPS) applications, which include control circuits. Power devices in which control functions are integrated, which enable, for example, self-protection of the power device in all operating conditions, are referred to as SMART-Power devices. For these devices, studies have been conducted on the integration also of the start-up part, for the purpose of increasing the efficiency of the power devices. In fact, the integration of the start-up function in the SMPS application enables a reduction in the dissipation of the devices in stand-by conditions, a reduction in the start-up times and a reduction in the number of external components.

According to the prior art, in smart power devices, the start-up function is currently integrated by inserting, within the IC control device, a high-voltage device, for example a MOSFET made up of just a few cells. However, in the majority of cases, this entails substantial problems in the fabrication of the IC control device. For example, integration of the IC device, which must be a high-voltage one, entails high production costs, in so far as it must be obtained on a high-voltage epitaxial thickness capable of supporting the inhibition voltage required and enable introduction of the necessary edge structure.

In addition, the fabrication of the IC control device on a high-voltage epitaxial thickness causes problems linked to the production of the IC device. In fact, when this is inhibited, if a voltage is applied from the outside which is higher than the breakdown voltage of the IC device, a process of avalanche multiplication is triggered therein and produces a current (avalanche current) that can destroy the IC device. If the inhibition voltage of the IC device is higher than the inhibition voltage of the MOSFET power device, the avalanche current will traverse the MOSFET power device, preventing problems to the IC device. Consequently, its inhibition voltage must be always higher than that of the MOSFET power device. On the other hand, the variability of the production process in the fabrication of the MOSFET power device and of the IC device requires that the inhibition voltage of the IC device should be much higher than that of the MOSFET power device. When this does not occur, there is destruction of the entire SMART-Power device.

Consequently, it is of particular importance to identify new and readily implementable strategies of integration of the start-up function, for the purpose of increasing the efficiency of the device and eliminating the risk of destruction of the SMART-Power device on account of the variability of the process.

SUMMARY OF THE INVENTION

One aim of the present invention is to provide a semiconductor power device having an integrated start-up structure that will satisfy the requirements indicated above.

According to one embodiment of the present invention, a semiconductor power device is provided, comprising a semiconductor body of a first conductivity type housing a power structure, wherein said semiconductor body comprises a first region housing a start-up structure and a second region housing said power structure.

BRIEF DESCRIPTION OF THE DRAWINGS

For an understanding of the present invention, a preferred embodiment thereof is now described, purely by way of non-limiting example and with reference to the attached drawings, wherein.

DETAILED DESCRIPTION

Figure 1A:
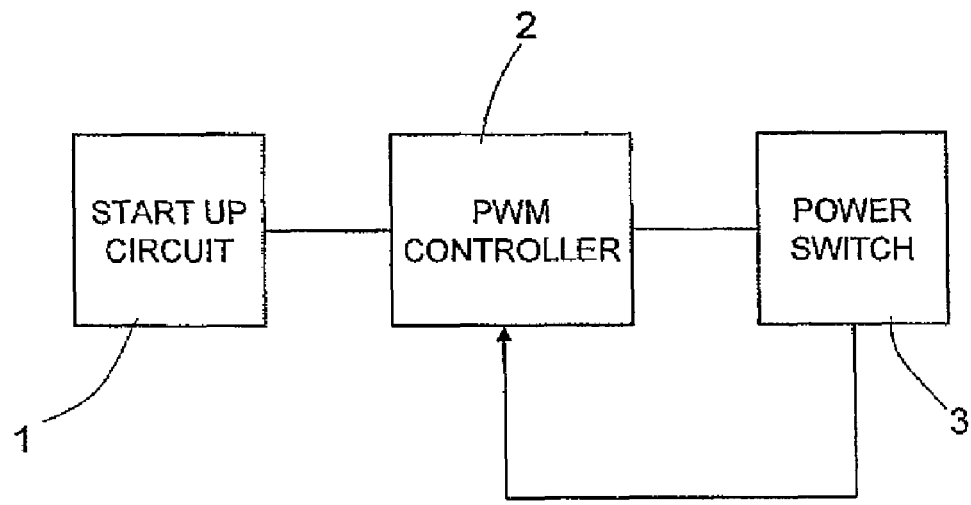
FIGS. 1a and 1b show two different block diagrams corresponding to an SMPS application, according to the prior art.

FIG. 1a shows the block diagram of an SMPS application comprising a start-up circuit 1 connected to a PWM (Pulse Width Modulation) controller 2, which is in turn connected to a power device 3 that functions as switch. The power device 3 is moreover feedback-connected to the PWM controller 2. In the SMPS application, the start-up block 1 turns on, or turns back on, the PWM controller 2, which in turn controls the state of the power device 3.

Figure 1B:
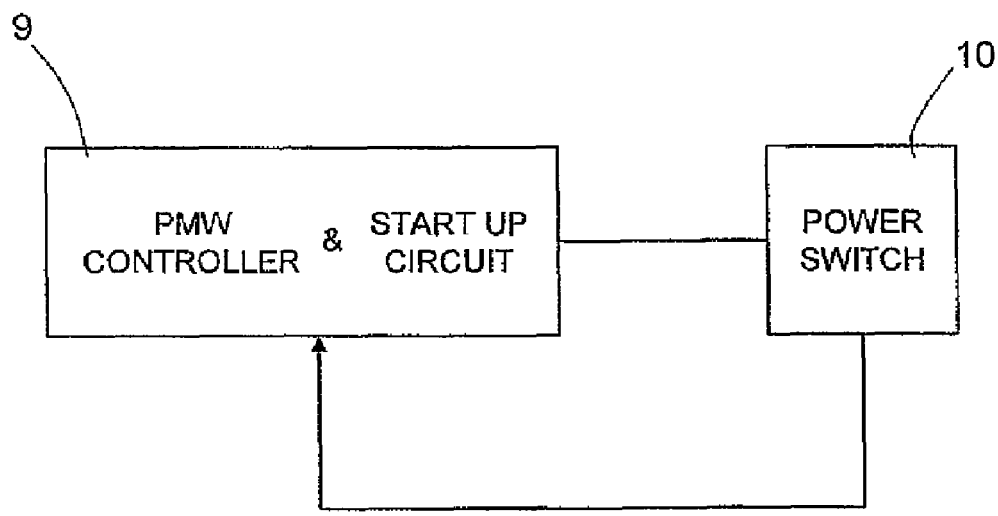

FIG. 1b shows a different known scheme in which the start-up circuit and the PWM controller are integrated in a single control block 9, which controls a power stage 10 integrating a power device 18.

Figure 2:
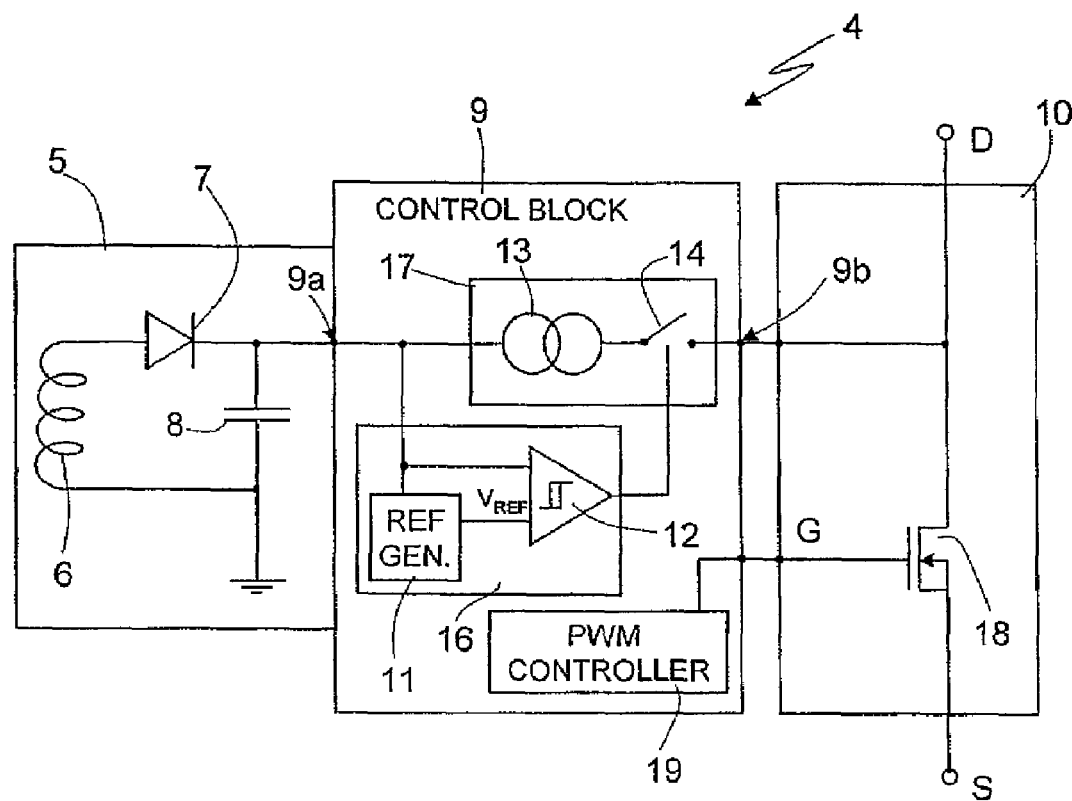
FIG. 2 shows the circuit diagram of the application of FIG. 1b.

FIG. 2 shows a circuit diagram implementing the known scheme of FIG. 1b as regards the components necessary for understanding the invention. In detail, the control block 9 comprises a start-up control circuit 16, a start-up circuit 17 and a PWM controller 19, of a known type and thus not shown in detail. The start-up control circuit 16 is formed by a voltage source 11, which generates a reference voltage $V_{REF}$, having a sawtooth waveform, and by a comparator 12. The start-up circuit 17 is formed by a current source 13 and by a switch 14. In detail, the comparator 12 has a first input connected with an input node 9a, a second input receiving the reference voltage $V_{REF}$, and an output connected to a control input of the switch 14. The current source 13 and the switch 14 are series-connected between an input node 9a and an output node 9b.

In the input node 9a, the control block 9 is connected to an AC/DC converter 5 formed by a secondary winding 6 of a transformer and by a rectifier, comprising a diode 7 and a capacitor 8. The diode 7 has its anode connected to a first terminal of the winding 6 and its cathode connected to the input node 9a of the control block 9. The capacitor 8 is connected between a second terminal of the winding 6 and the cathode of the diode 7.

The power device 18 is formed by a MOSFET having its drain terminal D, its source terminal S and its gate terminal G accessible from outside the chip. The drain terminal D is moreover connected to the output node 9b of the control block 9.

Upon starting-up, the voltage on the first input of the comparator 12 (i.e., the voltage on the input node 9a of the control block 9) is less than the reference voltage (the capacitor 8 is still discharged). The comparator 12 then issues a command for setting the switch 14 in the closing condition, thus enabling passage of the current from the current source 13 to the capacitor 8, which charges. In this step, the power device 18 is not conducting. When the voltage on the first input of the comparator 12 becomes equal to the reference voltage $V_{REF}$, the switch 14 is set in an opening condition and the power device 10 starts switching as controlled by the driving signals generated in a known way by the PWM controller 19 integrated in the control block 9. In practice, in the circuit of FIG. 2, the AC/DC converter 5 provides the continuous voltage necessary for rendering the comparator 12 operative; the start-up circuit 17 supplies the power device 18 through the drain terminal D thereof, and the PWM controller 19 drives the gate G of the power device 18 on the basis of the operation required of the power device 18.

Figure 3:
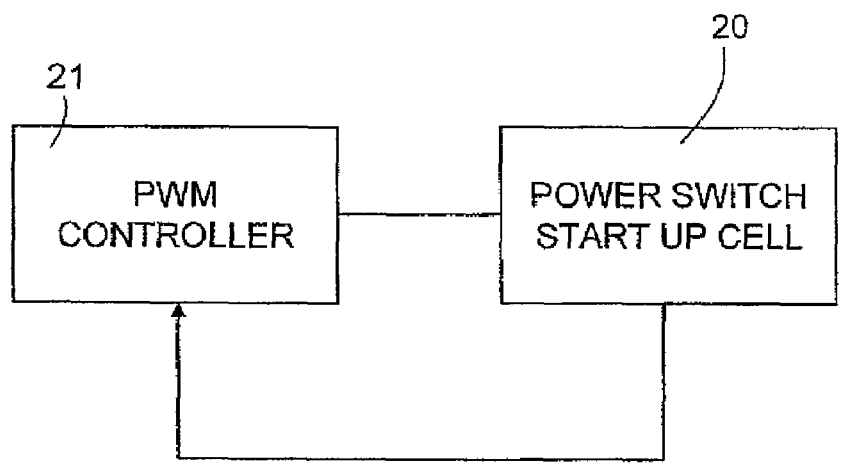
FIG. 3 shows a block diagram of an SMPS application which uses a semiconductor power device, according to the invention.

FIG. 3 shows a block diagram according to the invention including an integrated device 20 and a PWM controller 21.

According to FIG. 3, the integrated device 20 integrates a start-up circuit (corresponding to the start-up circuit 17 of FIG. 2) and a power device (designated by 18 in FIG. 2). Thus, the switch 14, which is formed by a MOSFET transistor integrated together with the power device 18, has the same inhibition voltage as the latter.

Figure 4:
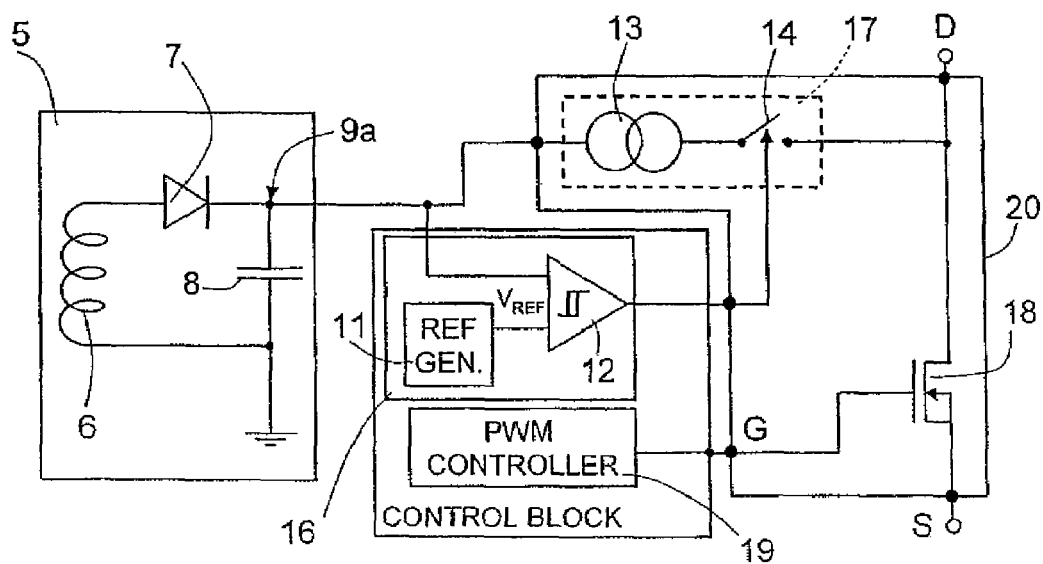
FIG. 4 shows the circuit diagram of the application of FIG. 3.

An electric circuit diagram of the SMPS application of FIG. 3 is shown in FIG. 4. Since the circuit structure of FIG. 4 is the same as in FIG. 2 and the two figures differ only in that the integrated device 20 integrates in a single chip both the start-up circuit 17 and the power device 18, the description of the SMPS application is not repeated and its electrical components are designated by the same reference numbers.

According to an aspect of the invention, the power device 18 surrounds the switch 14, albeit having separate gate regions. In addition, between the source regions of the power device 18 and of the switch 14 there is an insulation of more than 25 V, as emerges clearly from the representation of the physical implementation of the integrated device 20, shown in FIGS. 5 and 6, and corresponding to multi-drain (MD) MOSFET devices.

Figure 5:
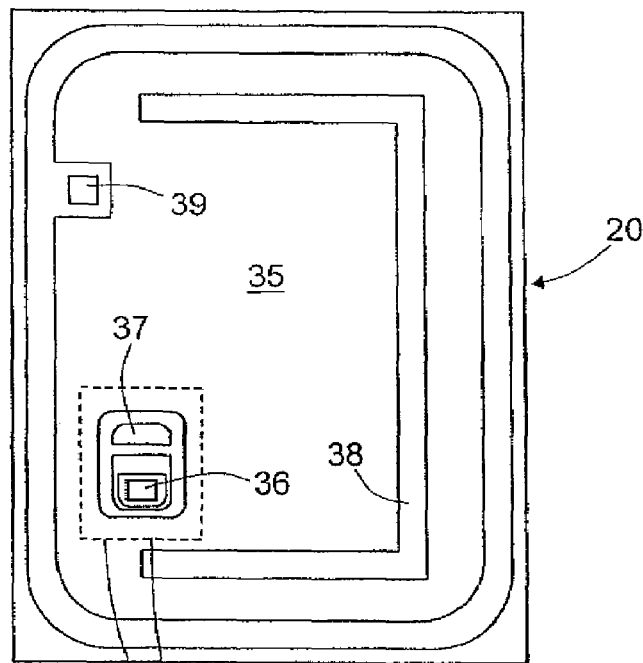
FIG. 5 shows the layout of a MOSFET power device containing a start-up MOSFET, according to the invention.
Figure 5:
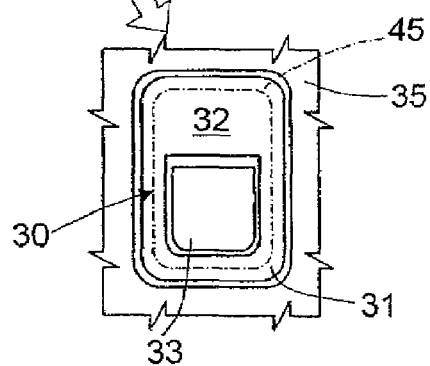

In detail, with reference to FIG. 5, the switch 14 is made in an area of the integrated device 20 that is surrounded by an edge structure 30. The edge structure 30 has an annular shape and is of the type with mirror symmetry that ensures the desired insulation between the power device 18 and the switch 14. The edge structure 30 comprises a metal annular region 31 electrically connected to and forming a single region with a gate metallization 32. In addition, the edge structure 30 comprises regions integrated in the silicon and visible in the cross-sectional view of FIG. 6, described in detail hereinafter.

The metal annular region 31 surrounds a switch source metallization 33 of the MOSFET switch 14 and is, in turn, surrounded by a main source metallization 35 of the power device 18. FIG. 5 moreover shows the corresponding pads, including a switch source pad 36, a switch gate pad 37, a power source pad 38, as well as a power gate pad 39 (the pads are not shown in the enlarged detail of FIG. 5, for reasons of clarity). The integrated device 20 further comprises other pads, corresponding to other components and parts of the integrated device 20, not shown.

Figure 6:
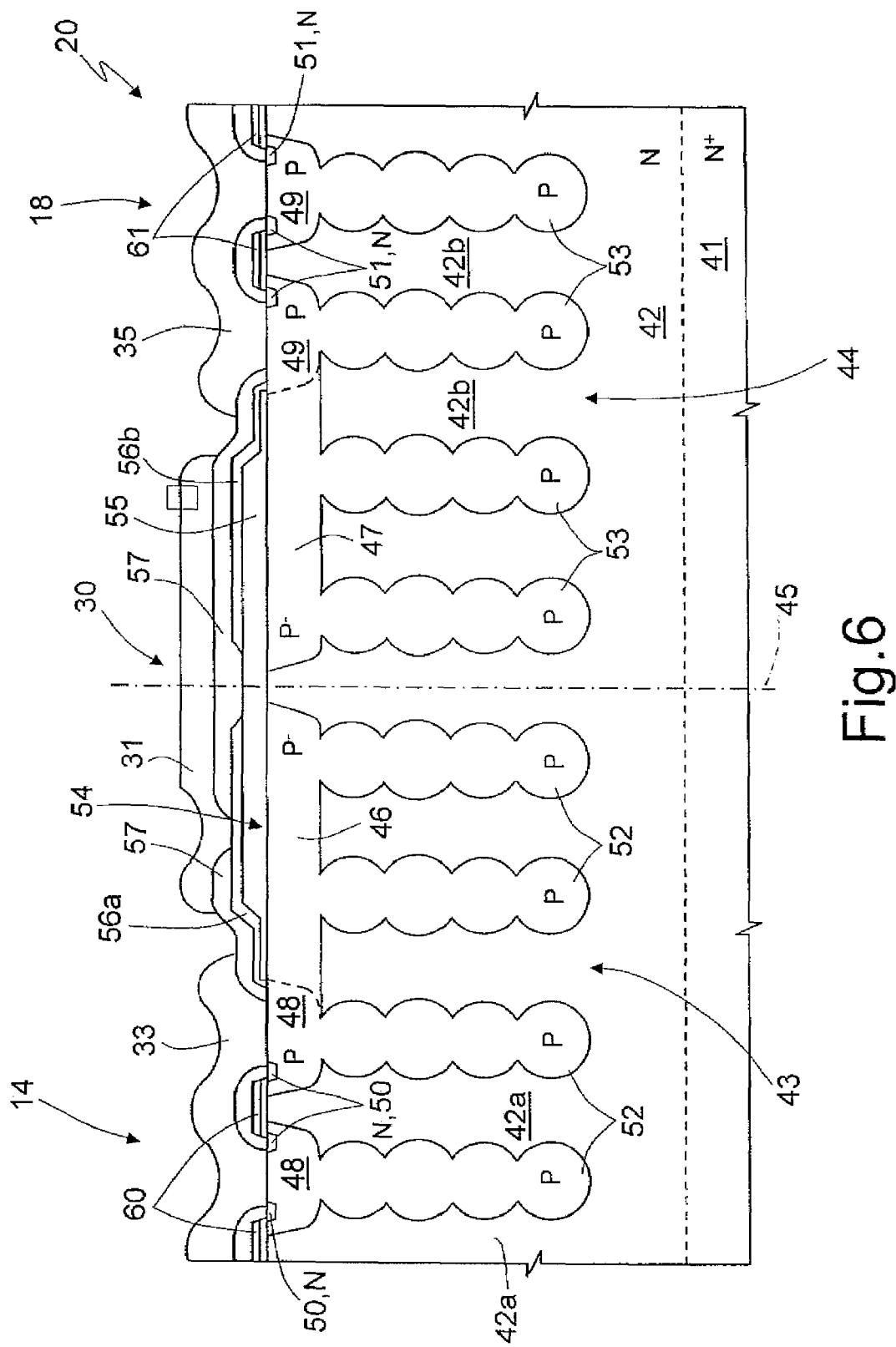
FIG. 6 is a cross-sectional view of the device, taken along the line VI-VI of FIG. 5.

FIG. 6 shows a cross-section of the integrated device 20 at the edge structure 30. In detail, the integrated device 20 comprises a substrate 41 of an $N^+$-type conductivity, overlaid by an epitaxial layer 42 of an N-type conductivity. The epitaxial layer 42 constitutes a first region 43 forming the MOSFET switch 14 (on the left in FIG. 6) and a second region 44 forming the power device 18 (on the right in FIG. 6). As explained above, in fact, the second region 44 surrounds completely the first region 43 and is separated therefrom, on all sides, by the edge region 30. Within the integrated device 20, the regions 43 and 44 are arranged in a mirror configuration with respect to a symmetry line 45 of an annular shape passing through the centre of the edge structure 30 (see the enlarged detail of FIG. 5).

Each region 43 and 44 houses mesh regions, designated, respectively, by 46 and 47, of a $P^-$-type conductivity, which form part of the edge structure 30.

The ends of the mesh regions 46 and 47 that are most remote from the symmetry line 45 form body regions designated respectively by 48 and 49 and having a P-type conductivity. Further body regions 48, 49 (two of which visible in FIG. 6) extend at the sides of the edge structure 30, respectively towards the left and towards the right in FIG. 6, to form the multi-drain structure of the MOSFET devices 14 and 18.

Source regions, respectively 50 and 51, of an N-type conductivity are formed within the body regions 48, 49.

The MOSFET devices 43 and 44 also comprise a plurality of columns 52 and 53, of a P-type conductivity. The columns 52 and 53 extend from the mesh regions 46, 47 (where they form the edge structure 30, together with the mesh regions 46, 47 and surface structures, described in detail hereinafter); the columns 52 and 53 further extend from the body regions 48, 49 and are doped so as to balance the charge of the epitaxial layer 42 of N-type conductivity (in this connection, see also U.S. Pat. No. 6,586,798 and U.S. Pat. No. 6,300,171, which are incorporated herein by reference, in regard to the manufacturing method and functions).

The columns 52 and 53 repeat periodically and are set at the same distance apart from one another so that the portions of epitaxial layer 42 delimited between them form a plurality of drain regions 42a and 42b, respectively, which are also repeated periodically and are set at the same distance apart from one another. The shape of the columns 52, 53 is uniquely defined by the process of implantation and diffusion described in the two US patents cited above. In particular, in the present application, the columns 52, 53 are all made simultaneously, have an equal depth and appropriate concentration. In this way, it is possible to reduce the resistivity of the epitaxial layer 42 and hence to obtain MOSFET structures with low output resistance, even for high values of the inhibition voltage. In the structure shown, the periodicity of the columns 52 and 53 is always maintained constant so as to ensure the charge balance in each point of the drain regions 42a, 42b and to prevent premature breakdown triggering.

The body of semiconductor material integrating the integrated device 20 and formed by the substrate 41 and by the epitaxial layer 42 has a top surface 54, on top of which polysilicon insulated-gate regions 60 and 61, respectively of the MOSFET switch 14 and of the power device 18, are formed. The insulated-gate regions 60 and 61 are connected to the respective gate metallizations (32 for the MOSFET switch 14) and to the respective pads 37 and 39 (FIG. 5). A first dielectric region 55 extends on the top surface 54, on top of the mesh regions 46 and 47, has an annular shape and extends throughout the width of the edge structure 30. Two polysilicon regions 56a, 56b extend on top of part of the first dielectric region 55 and around its internal and external edges. The polysilicon regions 56a, 56b are approximately aligned, in a vertical direction, to the mesh regions 46 and 47, respectively, are distinct and are arranged symmetrically with respect to the symmetry line 45. A dielectric layer 57 coats the polysilicon regions 56a, 56b and is interrupted only along an annular line where the metal annular region 31 is in direct electrical contact with the polysilicon region 56a. The polysilicon region 56b is, instead, electrically connected to the gate metallization of the power device 18, and hence to the gate regions 61.

FIG. 6 moreover shows the switch source metallization 33, which connects the source regions 50 and the respective body regions 48, and the main source metallization 35, which connects the source regions 51 and the respective body regions 49, in a per se known manner.

In a way not shown, the integrated device 20 houses further regions implementing further SMART functions (overcurrent, overtemperature and overvoltage controls).

As may be noted in particular from the enlarged detail of FIG. 5, the metallizations 31-32 form a continuous field-plate layer preventing outflow of the field lines to the area comprised between MOSFET switch 14 and power device 18.

In addition, the separation between the metallizations 31-32 and 33, between the mesh regions 46 and 47, between the source regions 50 and 51 and between the gate regions 60 and 61 of the MOSFET switch 14 and of the power device 18 ensures the insulation between the two devices of at least 25V.

Integration of the MOSFET device implementing the switch 14 in an insulated and independent way within the power device 18, or else within the power stage of a SMART-Power device, affords considerable economic advantages, in so far as it enables forming an IC device in a low-voltage silicon chip and reducing the silicon area occupied, since the edge structure and the epitaxial thickness are eliminated.

A further advantage is linked to the fact that the start-up structure is made simultaneously with the power MOSFET, using the same number of masks and the same process flowchart.

Finally, is clear that numerous modifications and variations may be made to the device described and illustrated herein, all of which fall within the scope of the invention, as defined in the annexed claims.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An integrated power device comprising a semiconductor body of a first conductivity type housing a power structure, wherein said semiconductor body comprises a first region housing a start-up structure comprising a switch having a first gate region and a second region-surrounding said first region, wherein said second region houses said power structure having a second gate region.

2. The device according to claim 1, wherein said start-up structure and said power structure are separated from one another by an edge structure.

3. The device according to claim 2, wherein said start-up structure and said power structure are arranged in a mirror configuration with respect to a symmetry line crossing said edge structure.

4. The device according to claim 1, wherein said start-up structure is a first MOSFET device and said power structure is a second MOSFET device.

5. The device according to claim 4, wherein said first and second MOSFET devices are multi-drain MOSFET devices, comprising respective body regions of a second conductivity type, respective gate regions arranged on top of said semiconductor body, respective source regions of said first conductivity type, and respective drain regions of said first conductivity type.

6. The device according to claim 5, further comprising column structures of said second conductivity type, which extend within said semiconductor body underneath and from said body regions and which separate from one another two distinct pluralities of drain regions.

7. The device according to claim 6, wherein said column structures repeat periodically and are equidistant from one another so as to maintain a fixed distance between said distinct drain regions of each plurality.

8. The device according to claim 5, comprising an edge structure extending between said first and second MOSFET devices and including two mesh regions that extend in a surface area of said semiconductor body and have said second conductivity type.

9. The device according to claim 8, wherein said mesh regions are distinct and are arranged specularly with respect to a symmetry line crossing said edge structure.

10. The device according to claim 8, wherein said edge structure further comprises column structures of said second conductivity type which extend within said semiconductor body underneath and from said mesh regions, said column structures having said second conductivity type and a higher doping level than said mesh regions.

11. The device according to claim 9, wherein said edge structure further comprises surface conductive regions extending on top of said semiconductor body.

12. The device according to claim 11, wherein said surface conductive regions comprise polysilicon regions distinct from one another, extending specularly with respect to said symmetry line, and a metal region extending on top of said polysilicon regions and electrically connected to one of said polysilicon regions.

13. The device according to claim 12, wherein said metal region forms a gate metallization for said first MOSFET device.

14. The device according to claim 8, wherein said edge structure provides an insulation of not less than 25 Volt.

15. An integrated power device comprising:
  a start-up circuit comprising a switch and a first gate region, wherein the start-up circuit is disposed in a first region of a semiconductor body having a first conductivity type; and
  a power circuit comprising a second gate region and disposed in a second region of said semiconductor body surrounding said first region of said semiconductor body.

16. The device according to claim 15, further comprising an annular-shaped edge structure disposed between said first region and said second region to provide electrical isolation between said start-up circuit and said power circuit.

17. The device according to claim 15, wherein each of said start-up circuit and said power circuit is a multi-drain MOSFET device, comprising a body region of a second conductivity type, at least one gate region arranged on top of said semiconductor body, at least one source region of said first conductivity type, and at least two drain regions of said first conductivity type.

18. The device according to claim 17 further comprising an edge structure extending between said start-up circuit and said power circuit, wherein said edge structure comprises two mesh regions that extend in a surface area of said semiconductor body and have said second conductivity type.

19. The device according to claim 18, wherein said mesh regions are distinct and are arranged specularly with respect to a symmetry line crossing said edge structure.

20. The device according to claim 19, wherein said edge structure further comprises surface conductive regions extending on top of said semiconductor body, wherein said surface conductive regions comprise polysilicon regions distinct from one another, extending specularly with respect to said symmetry line, and a metal region extending on top of said polysilicon regions and electrically connected to one of said polysilicon regions.

\* \* \* \* \*